US011713948B2

United States Patent
Abboud et al.

(10) Patent No.: US 11,713,948 B2
(45) Date of Patent: *Aug. 1, 2023

(54) CEW WEAPON SYSTEM AND RELATED METHODS

(71) Applicant: Leonidas IP, LLC, St. John's (AG)

(72) Inventors: Steven Abboud, Davenport, FL (US); Kevin Chang, Taichung (TW); Ivo Foldyna, Boise, ID (US)

(73) Assignee: Leonidas IP, LLC, St John's (AG)

( * ) Notice: Subject to any disclaimer, the term of this patent is extended or adjusted under 35 U.S.C. 154(b) by 0 days.

This patent is subject to a terminal disclaimer.

(21) Appl. No.: 17/650,350

(22) Filed: Feb. 8, 2022

(65) Prior Publication Data

US 2022/0163294 A1   May 26, 2022

Related U.S. Application Data

(63) Continuation of application No. 16/996,583, filed on Aug. 18, 2020, now Pat. No. 11,243,054, which is a (Continued)

(51) Int. Cl.
*F41H 13/00* (2006.01)
*H03K 5/26* (2006.01)
(Continued)

(52) U.S. Cl.
CPC ..... *F41H 13/0025* (2013.01); *F41H 13/0018* (2013.01); *H03K 5/19* (2013.01); *H03K 5/26* (2013.01); *H05C 1/06* (2013.01)

(58) Field of Classification Search
CPC .................. F41H 13/0012–0025; F41B 15/04
See application file for complete search history.

(56) References Cited

U.S. PATENT DOCUMENTS 4,619,265 A   10/1986   Morgan et al.
5,193,048 A   3/1993   Kaufman et al.
(Continued)

FOREIGN PATENT DOCUMENTS

CN   101944433 A   1/2011
CN   103727840 A   4/2014
EP   2328388 A2    6/2011

OTHER PUBLICATIONS

International Search Report/Written Opinion, PCT Patent Application No. PCT/IB2018/000652, dated Nov. 15, 2018, 9 pages.
(Continued)

*Primary Examiner* — Jared Fureman
*Assistant Examiner* — Christopher J Clark
(74) *Attorney, Agent, or Firm* — IPTechLaw

(57) ABSTRACT

Implementations of conductive energy weapons (CEWs) may include a shock generating circuit configured to couple to a power source, two electrodes operatively coupled to the shock generating circuit, and a safety circuit operatively coupled to the shock generating circuit. The shock generating circuit may be configured to generate a first pulse train and deliver the first pulse train to a target, and may be configured to generate at least a second pulse train and deliver the at least second pulse train to a target. The safety circuit may be configured to prevent the CEW from applying pulse trains to the target after a predetermined number of pulse trains. The first pulse train may include two or more pulses having waveforms substantially identical with each other, each of the waveforms of the two or more pulses having both a positive voltage segment and a negative voltage segment.

10 Claims, 5 Drawing Sheets

Related U.S. Application Data continuation of application No. 15/870,942, filed on Jan. 13, 2018, now Pat. No. 10,746,510.

(60) Provisional application No. 62/446,368, filed on Jan. 14, 2017.

(51) Int. Cl.
*H03K 5/19* (2006.01)
*H05C 1/06* (2006.01)

(56) References Cited

U.S. PATENT DOCUMENTS

| | | | |
|---|---|---|---|
| 7,145,762 B2 | 12/2006 | Nerheim | |
| 7,305,787 B1 | 12/2007 | Stratbucker | |
| 7,327,549 B2 | 2/2008 | Smith et al. | |
| 7,554,786 B2 | 6/2009 | Kramer et al. | |
| 7,821,766 B2 | 10/2010 | Brundula | |
| 8,254,080 B1 | 8/2012 | Nerheim | |
| 8,342,098 B2 | 1/2013 | Shalev et al. | |
| 9,739,578 B1 | 8/2017 | Abboud et al. | |
| 10,746,510 B2 | 8/2020 | Abboud et al. | |
| 2004/0156162 A1 | 8/2004 | Nerheim | |
| 2006/0255775 A1 | 11/2006 | Kramer et al. | |
| 2007/0101893 A1 | 5/2007 | Shalev et al. | |
| 2008/0123240 A1 | 5/2008 | Nerheim | |
| 2008/0259520 A1 | 10/2008 | Brundula | |
| 2009/0231776 A1* | 9/2009 | Kramer | F41H 13/0012 361/232 |
| 2012/0078554 A1* | 3/2012 | Gagnon | F41B 15/04 702/64 |
| 2012/0250210 A1 | 10/2012 | Ziriax et al. | |
| 2012/0262293 A1 | 10/2012 | Brave et al. | |
| 2013/0083447 A2 | 4/2013 | D'Andrea et al. | |
| 2015/0153144 A1 | 6/2015 | Cheatham, III et al. | |
| 2015/0328462 A1 | 11/2015 | Griffith | |
| 2017/0245355 A1 | 8/2017 | Handel et al. | |

OTHER PUBLICATIONS

International Search Report/Written Opinion, PCT Patent Application No. PCT/IB2018/013687, dated May 3, 2018, 11 pages.

\* cited by examiner

CEW WEAPON SYSTEM AND RELATED METHODS

CROSS REFERENCE TO RELATED APPLICATIONS

This document is a continuation of U.S. patent Ser. No. 16/996,583 to Abboud et al., entitled, "CEW Weapon System and Related Methods," now pending, filed Aug. 18, 2020, which application was a continuation of U.S. patent application Ser. No. 15/870,942 to Abboud et al., entitled, "CEW Weapon System and Related Methods," filed Jan. 13, 2018, now U.S. Pat. No. 10,746,510, issued Aug. 18, 2020, the disclosures of each of which are hereby incorporated entirely herein by reference.

This document also claims the benefit of the filing date of U.S. Provisional Patent Application 62/446,368, entitled "CEW Weapon System and Related Methods" to Abboud et al. which was filed on Jan. 14, 2017, the disclosure of which is hereby incorporated entirely herein by reference.

BACKGROUND

1. Technical Field

Aspects of this document relate generally to conductive energy weapon (CEW) systems and related methods for interrupting the locomotion of a target, such as a human or an animal. More specific implementations involve CEW systems that utilize short-duration electrical pulses.

2. Background

Conventionally, CEW systems work by delivering repeated electrical signals to the skin and subcutaneous tissues of a target. Short-duration electrical discharges into the target are more effective in stimulating nerves causing pain, incapacitation, and uncontrollable muscle contractions than they are in stimulating heart muscle tissue. In this way CEW systems work to stop the movement of a target without disrupting the target's heart pumping rhythm, which can be fatal.

SUMMARY

Implementations of conductive energy weapons (CEWs) may include a shock generating circuit configured to couple to a power source, a first electrode and a second electrode operatively coupled to the shock generating circuit, and a safety circuit operatively coupled to the shock generating circuit. The shock generating circuit may be configured to generate a first pulse train and deliver the first pulse train to a target using the first electrode and the second electrode, and may be configured to generate at least a second pulse train and deliver the at least second pulse train to a target using the first electrode and the second electrode. The safety circuit may be configured to prevent the CEW from applying pulse trains to the target after a predetermined number of pulse trains beyond the at least second pulse train. The first pulse train may include two or more pulses having waveforms substantially identical with each other, each of the waveforms of the two or more pulses having both a positive voltage segment and a negative voltage segment.

Implementations of CEWs may include one, all, or any of the following:

The positive voltage segment of each waveform may precede the negative voltage segment of each waveform.

A portion of the pulse corresponding to the positive voltage segment of the waveform of the pulse may include more charge than a portion of the pulse corresponding to the negative voltage segment of the waveform of the pulse.

A portion of the pulse corresponding to the positive voltage segment of the waveform of the pulse may include substantially twice as much charge as a portion of the pulse corresponding to the negative voltage segment of the waveform of the pulse.

The positive voltage segment may correspond with an arc phase configured to produce a plasma discharge between the first electrode and the target and the second electrode and the target.

Each waveform may reach a peak amplitude in less than 10 microseconds from the beginning of each waveform.

Each waveform may reach a peak amplitude in less than 5 microseconds from the beginning of each waveform.

A duration of the positive voltage segment of each waveform may be substantially less than a duration of the negative voltage segment of each waveform.

Implementations of conductive energy weapons (CEWs) may include a shock generating circuit configured to couple to a power source, a first electrode and a second electrode operatively coupled to the shock generating circuit, and a safety circuit operatively coupled to the shock generating circuit. The shock generating circuit may be configured to generate a waveform of a first pulse applied to a target using the first electrode and the second electrode. The waveform may include a positive voltage segment followed by a negative voltage segment. The shock generating circuit may be configured to generate a waveform of a second pulse applied to a target using the first electrode and the second electrode and the waveform of the second pulse may be substantially the same as the waveform of the first pulse. The safety circuit may be configured to deactivate the CEW after 3 pulse trains, each pulse train including no more than 100 pulses.

Implementations of CEWs may include one, all, or any of the following:

The CEW may be a non-sinusoidal waveform weapon.

Each pulse may deliver substantially 60 microCoulombs of charge.

Each pulse may deliver a majority of its charge within the first 15 microseconds of each pulse.

Each pulse may last substantially 100 microseconds.

The safety circuit may enforce a fixed-time pause between a time of a third pulse train and a time of a next pulse train that a user can apply.

The positive voltage segment of each waveform may precede the negative voltage segment of each waveform.

Implementations of conductive energy weapons (CEWs) may include a shock generating circuit configured to couple to a power source, a first electrode and a second electrode operatively coupled to the shock generating circuit, and a safety circuit operatively coupled to the shock generating circuit. The shock generating circuit may be configured to generate a plurality of pulses and apply the plurality of pulses to a target using the first electrode and the second electrode. The safety circuit may be configured to deactivate the CEW after a predetermined number of pulses. Implementations of CEWs may also include a target heart rate detection circuit coupled with the shock generating circuit. The target heart rate detection circuit may be configured to detect a target's heart rate either before or during the shock generating circuit applying any pulses to the target using the first electrode and the second electrode. The target heart rate detection circuit and the shock generating circuit may be configured to electrically synchronize an application rate of the plurality of pulses with the target's heart rate.

Each pulse may include a positive voltage segment and a negative voltage segment, wherein the positive voltage segment precedes the negative voltage segment.

The safety circuit may enforce a fixed-time pause between a time of the predetermined number of pulses and a time of a next pulse train that a user can apply.

The target heart rate detection circuit and the shock generating circuit may be configured to electrically synchronize the application rate of the plurality of pulses with the target's heart rate through an algorithm that may be based on a statistical regression based on collected heart rate data.

Each pulse may deliver a majority of its charge within the first 20% of an entire duration of each pulse.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended conductive energy weapon (CEW) systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such CEW systems, and implementing components and methods, consistent with the intended operation and methods.

Figure 9:
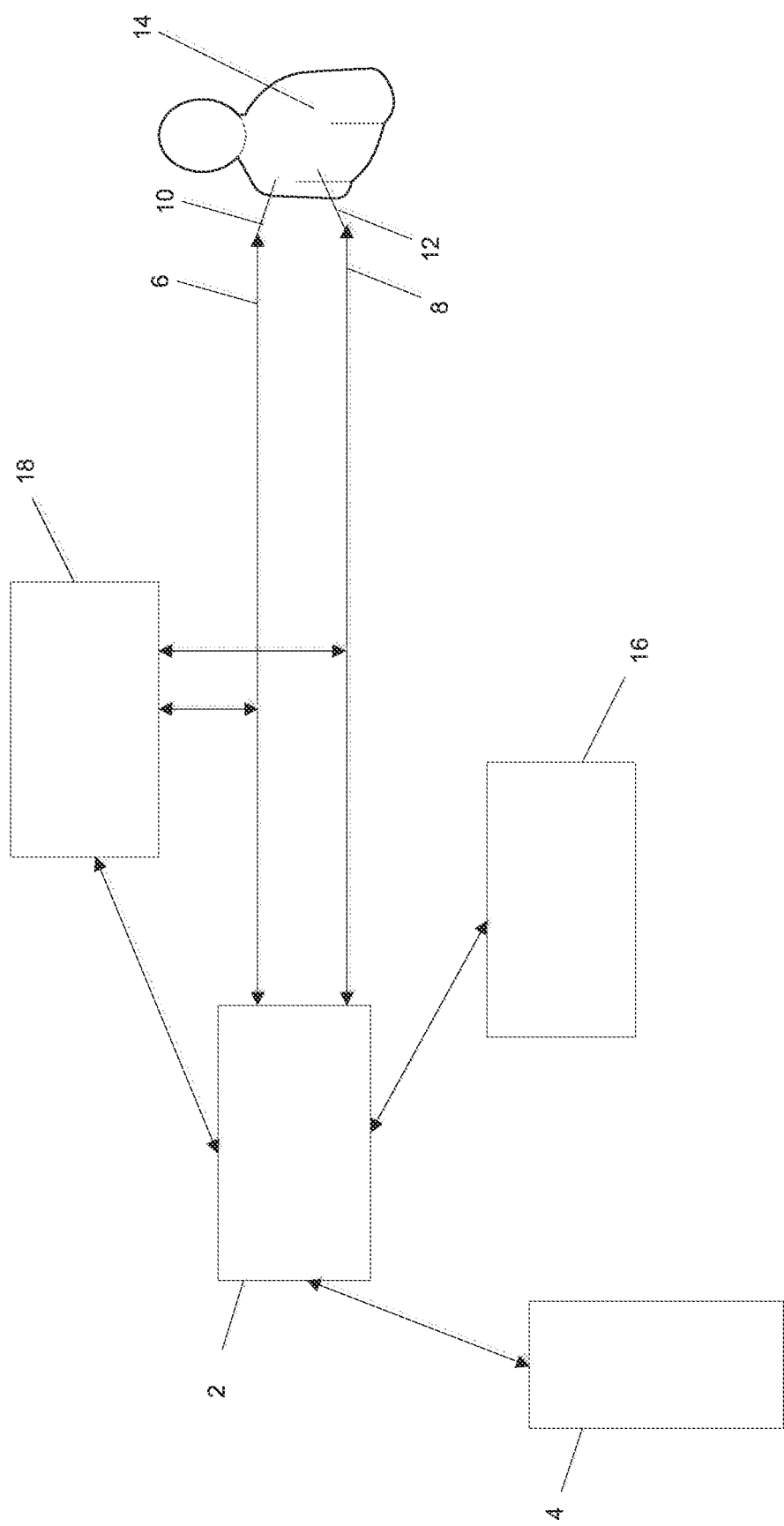
FIG. 9 is a block diagram of a CEW system.

In various implementations, referring to FIG. 9, CEW systems involve a shock generating circuit 2 connected to a power source 4. The power source 4 may be a direct current (DC) power source, and in particular implementations may be a battery. The shock generating circuit 2 is also operatively coupled to two spaced apart electrodes 6, 8. Many different shock generating circuits have been devised that are capable of generating various electrical signals that include one or more sets of electrical pulses that have a frequency (repetition rate), pulse energy, pulse charge, pulse voltage, average voltage, and current and making them available to the electrodes of the weapon. In some shock generating circuits, one or more transformers are included coupled to one or more capacitors that operate in combination to increase the voltage of the signal from the battery and create a pulsed electrical signal (such as a fly-back transformer system). In other shock generating circuit systems, capacitors and diodes are arranged in a circuit (such as through a Cockcroft-Walton voltage multiplier) to allow for amplification of the voltage as desired without the use of a transformer while delivering a pulsed electrical signal. The structure, as well as the method of operation, of various shock generating circuits used for CEW weapon implementations disclosed herein (as well as other components of the CEW) may be the same as, or similar to the structure and method of operation of the implementations of shock generating circuits (and other components of the CEW) disclosed in U.S. Pat. No. 7,554,786 to Kramer entitled "Electronic Disabling Device Having a Non-Sinusoidal Output Waveform," issued Jun. 30, 2009, the disclosure of which is hereby incorporated entirely herein by reference.

In various CEW weapon system implementations, the electrodes 6, 8 are physical electrodes located on the surface of the weapon. In other implementations, the electrodes 6, 8 are internal electrodes coupled with a CEW cartridge that contains two or more darts 10, 12 connected via wire to the electrodes. In other CEW systems, both the physically exposed electrodes and internal electrodes couplable with the CEW cartridge are included in the structure of the weapon.

During operation of the weapon on a remote target, for CEW weapons employing dart cartridges, the CEW weapon is designed to apply an electrical signal to the cartridge, causing the darts 10, 12 to be expelled from the cartridge under what may be the force of pressurized gas (often N2) stored in the cartridge. The pressurized gas may be released through, by non-limiting example, a fusable link, explosion of a squib or other pyrotechnic charge, or device that causes the pressurized gas to be released from a storage container in the cartridge. The darts 10, 12 then move in the direction of the target 14, trailing the wires which connect them to the internal electrodes of the CEW weapon. When the darts strike the target, barbs in the darts 10, 12 couple the darts to the target's skin, clothing, or hair. If the darts are spaced widely enough apart across the target, incapacitation of the target 14 is more likely as it increases the amount of the target that will be exposed to the electrical signal.

During operation of the weapon on a close range target, the CEW weapon applies the electrical signal directly to the exposed electrodes on the surface of the weapon which are placed directly on the skin and/or clothing of the target. In this way, the electrical signal from the shock generating circuit is applied directly to the target from the weapon without the use of darts. This is referred to at times as the CEW weapon operating in "dry stun" mode.

Beyond the pain experienced by the target as the electricity stimulates the nerves and tissue, CEWs influence the peripheral nervous system in ways that cause temporary, involuntary, and uncoordinated skeletal muscle contractions. Influenced by factors that include characteristics of the target, the response of the target to the electrical signal delivered by the CEW depends on the strength, duration, and the shape of the waveform of the electrical discharge, as well as the timing of the applied electrical current in comparison to the natural electrical activity occurring in the body. The ability of CEWs to stimulate some tissues (such as nerve cells) and not others (such as heart muscle cells) is governed by the characteristics of the electrical signals. Nerve cells respond to electrical waveforms that are much shorter in duration than those heart muscle cells respond to. It is known that the duration of electrical stimulation required to exceed the stimulation threshold of a human cardiac heart muscle cell is about 10 to 100 times longer than the stimulation threshold of a motor or sensor nerve cell. Accordingly, CEWs work to apply short-duration electrical discharges in the ranges most likely to stimulate nerve cells and less effective in stimulating the heart muscle tissue.

In various implementations, referring to FIG. 9 the shock generating circuit 2 is configured to generate a first pulse train (first set of pulses) and deliver the first pulse train to a target using the first electrode 6 and the second electrode 8. Similarly, in various implementations the shock generating circuit 2 may be configured to generate a second pulse train and deliver the second pulse train to the target using the two electrodes 6, 8. In various implementations, the number of pulse trains is limited to two or three, however, in other implementations, the shock generating circuit may be configured to generate and deliver any predetermined number of pulse trains. Each pulse train includes two or more pulses. In various implementations, the two or more pulses have waveforms that are substantially identical, while in other implementations the two or more pulses may varying waveforms compared with each other. In various implementations, the waveforms of the pulses may have both a positive voltage segment and a negative voltage segment, while in other implementations the waveform may only include a positive voltage segment or only a negative voltage segment. In various implementations, each waveform is non-sinusoidal.

Each pulse may include an initial arc phase. During the arc phase, a short high voltage impulse signal is applied to the darts to create an electrical arc (plasma discharge) through any air gaps and the tissue of the subject by producing a plasma between the first electrode 6 and the target 14 and between the second electrode 8 and the target 14. Once the plasma has been created, the resistance to subsequent current flow reduces by orders of magnitude. The main phase then immediately follows the arc phase and is generally of a much longer time duration with a lower voltage. Conventional CEWs deliver a small portion of the total net charge applied to the target during operation of the weapon during the arc phase and most of the total net charge to the target during the main phase.

Implementations of CEW systems disclosed herein utilize waveforms that deliver most of the total net charge during the short period arc phase and the remainder lesser portion during the longer period main phase. Since less of the charge is actually applied during the main phase, in this document the term "main phase" will be referred to as "stimulation maintenance phase." These waveforms are generated using the shock generating circuit. In some implementations, the shock generating circuit 2 may include a boost transformer and an ignition transformer that acts as a constant current source that creates a decaying current waveform with a peak amperage of about 10 amperes. A series of three diodes wired in series may be, in various implementations, coupled to the boost transformer and the ignition transformer and form a half wave rectifier. In various implementations, these diodes are coupled to the two electrodes, whether internal electrodes or electrodes exposed on the outside of the weapon. In various implementations, the CEW system may be the same as or similar to that disclosed in U.S. patent application Ser. No. 14/632,958 to Steven Abboud, entitled "Safety Guard for Conductive Energy Weapon Ammunition and Related Methods," filed Feb. 26, 2015, the disclosure of which is hereby incorporated entirely herein by reference. Likewise, the CEW system may use ammunition that is the same as or similar to that disclosed in U.S. patent application Ser. No. 14/288,249 to Abboud et al., entitled "Conductive Energy Weapon Ammunition," filed May 27, 2014, now U.S. Pat. No. 9,739,578, issued Aug. 22, 2017, the disclosure of which is hereby incorporated entirely herein by reference. Finally, the CEW system may be the same as or similar to any system disclosed in U.S. Pat. No. 7,554,786 to Kramer which was previously incorporated herein by reference.

Figure 1:
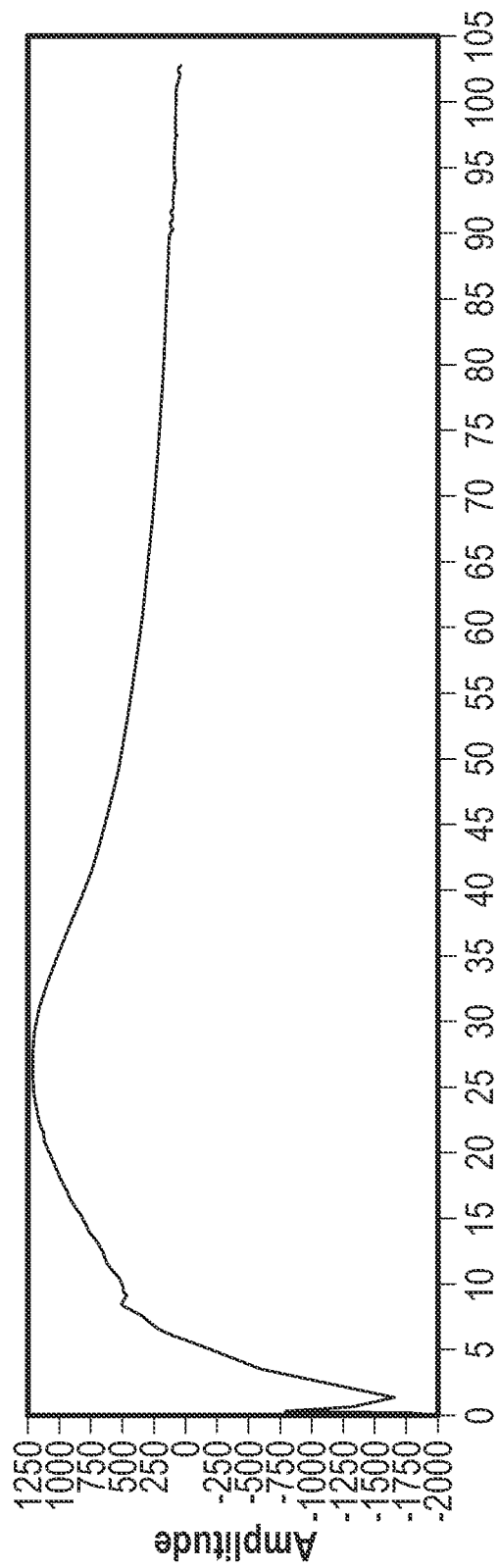
FIG. 1 is a chart illustrating the amplitude of a waveform of a single pulse of a conventional CEW.
Figure 2:
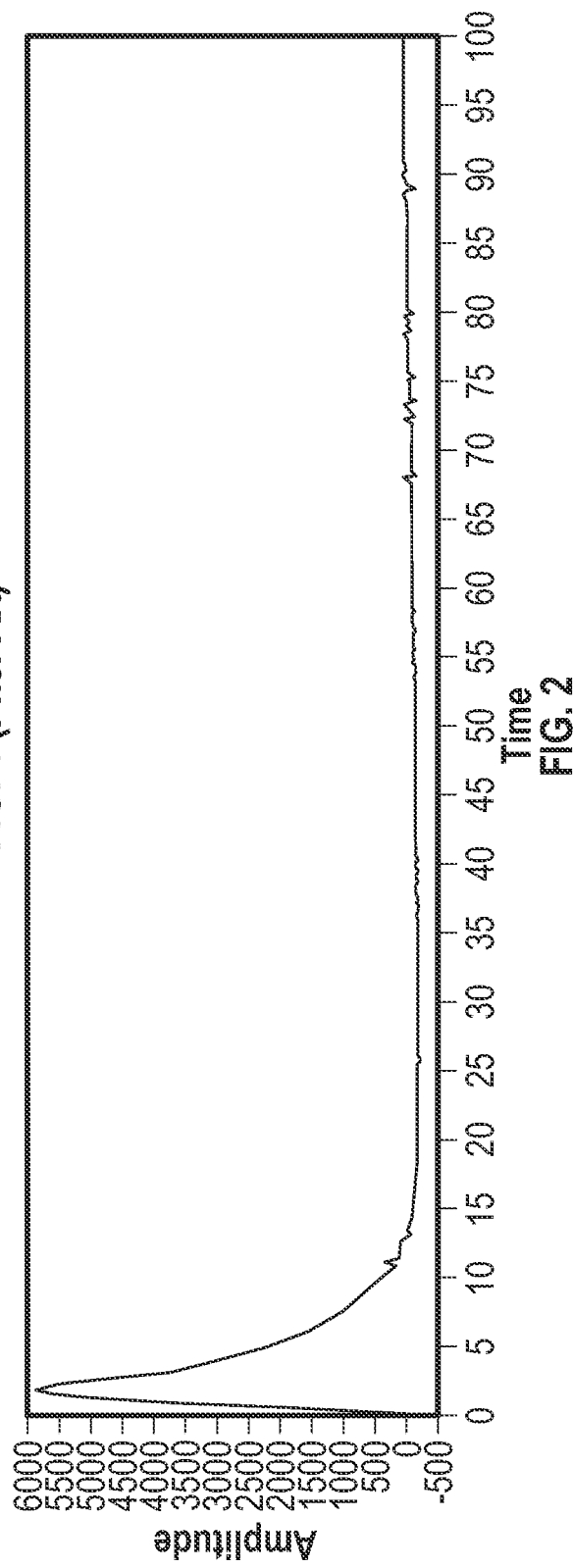
FIG. 2 is a chart illustrating the amplitude of a waveform of a single pulse of a CEW.

The difference in the pulse waveforms between conventional CEW systems and those disclosed herein is illustrated by reference to FIGS. 1 and 2. FIG. 1 is a chart illustrating the amplitude (in volts) of a waveform of a single pulse of a conventional CEW measured at the outside electrodes of the CEW on a non-inductive 600 Ohm resistor. Time is measured in microseconds. FIG. 2 is a similar chart illustrating the amplitude of a waveform of a single pulse of a CEW as disclosed herein measured at the outside electrodes of the CEW on a non-inductive 600 Ohm resistor. Both pulses last about 100 microseconds, though in other implementations the pulses may be longer or shorter than 100 microseconds. As can be observed in FIG. 1, the waveform representing the amplitude of the signal corresponding to the conventional CEW spikes initially, and then rises back up to a maximum value around 27 microseconds. In contrast, in FIG. 2, the waveform representing the amplitude of the signal corresponding to the present CEW spikes rapidly to a maximum value of about 6000 V around 3 microseconds. In other implementations, the waveform may reach a peak amplitude in more or less than 3 microseconds. In particular implementations, the waveform reaches a peak amplitude in less than 10 microseconds, and in more particular implementations, the waveform reaches a peak amplitude in less than 5 microseconds. The highest amplitude value in FIG. 2 is approximately 4 times greater than the highest amplitude value in FIG. 1. As indicated by FIG. 2, the waveform of the pulse also includes a positive voltage segment between 0 microseconds and approximately 13 microseconds and a negative voltage segment between approximately 13 microseconds and 100 microseconds. In various implementations, and as illustrated by FIG. 2, the positive voltage segment of the waveform of the pulse may precede the negative voltage segment of the waveform of the pulse. This is contrary to the behavior of pulses found in conventional systems, as is illustrated by FIG. 1, which have a negative voltage segment precede the positive voltage segment. In various implementations, the duration of the positive voltage segment of the waveform may be shorter, longer, or the same duration of the negative voltage segment of the waveform. In particular implementations, and as illustrated by FIG. 2, the positive voltage segment only lasts about 13 microseconds while the negative voltage segment lasts about 80-90 microseconds.

Figure 3:
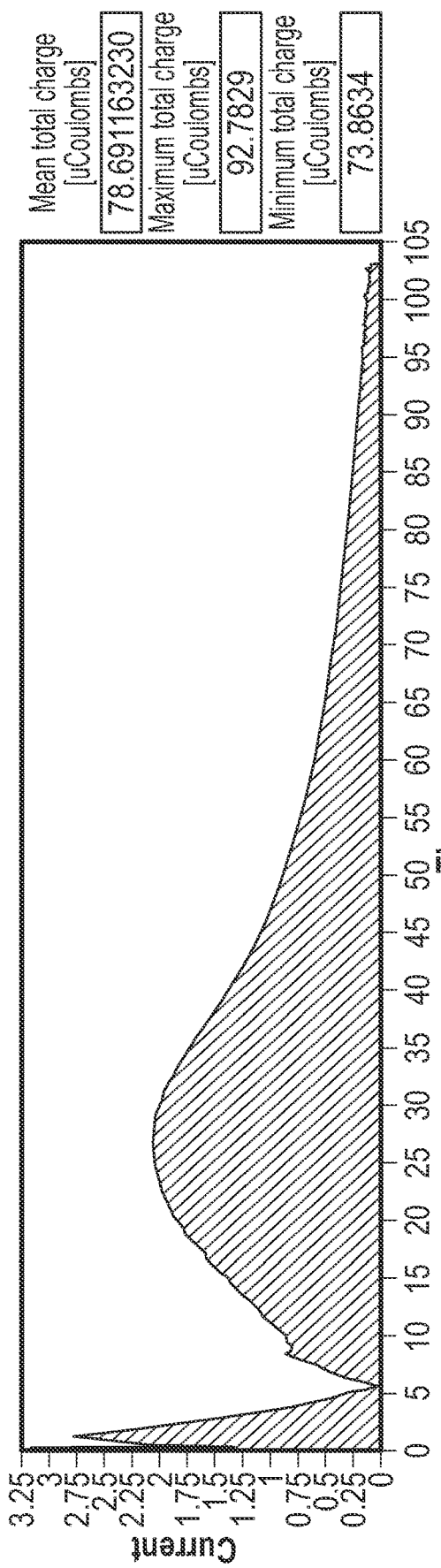
FIG. 3 is a chart illustrating current versus time of a pulse of a conventional CEW.
Figure 4:
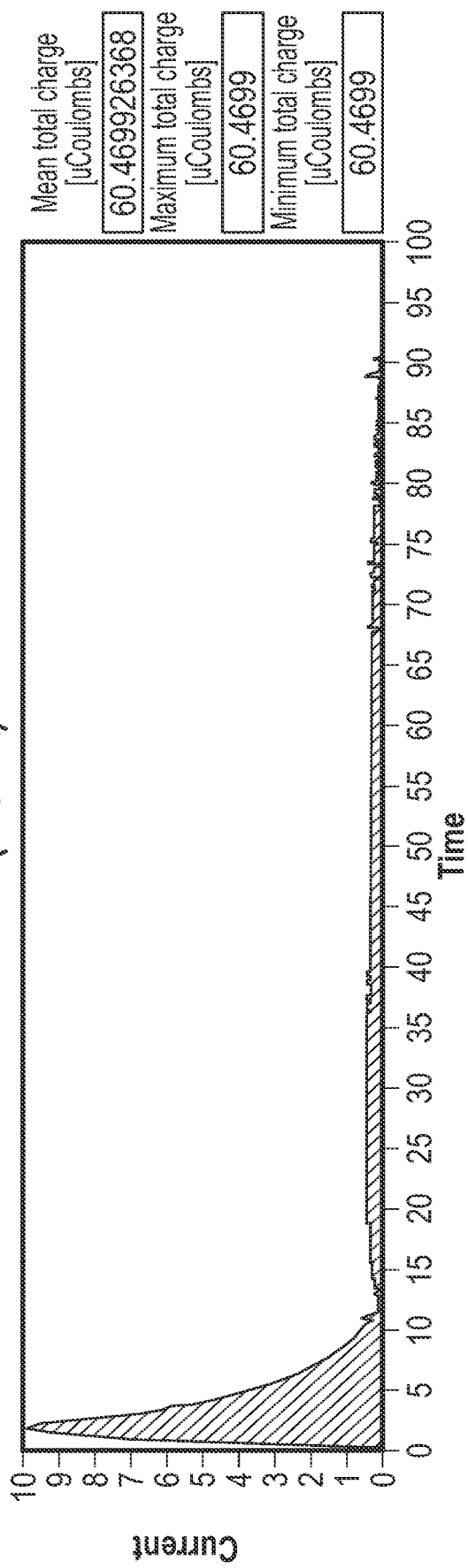
FIG. 4 is a chart illustrating current versus time of a pulse of a CEW.

The effect of the difference in waveforms (as illustrated by FIG. 1 and FIG. 2) on the total charge can be best observed by referring to FIG. 3, which is a chart illustrating current versus time (in microseconds) of a pulse of a conventional CEW, and FIG. 4, which is a similar chart illustrating current versus time of a pulse of a CEW disclosed herein. As can be observed, the initial arc phase from 0 to 5 milliseconds in FIG. 3 carries about 8 microCoulombs of charge. It is then followed by the main phase which includes the majority of the electrical charge of about 80 microCoulombs. In contrast, the initial arc phase in FIG. 4 includes about 40 microCoulombs of charge followed by a much lower current and longer duration main phase containing about 20 microCoulombs of charge. Thus, in various implementations, the portion of the pulse corresponding to the positive voltage segment of the waveform of the pulse may include more charge than the portion of the pulse corresponding to the negative voltage segment of the waveform of the pulse. Indeed, in particular implementations, as illustrated by FIG. 4, the portion of the pulse corresponding to the positive voltage segment of the waveform of the pulse may include substantially twice as much charge as the portion of the pulse corresponding to the negative voltage segment of the waveform of the pulse, though in other implementations the negative voltage segment may include more or less charge than this. In various implementations, and as illustrated by FIG. 4, the majority of the charge of the pulse is delivered within the first 15 microseconds of each pulse, or within at least the first 20% of the length of the duration of each pulse. In other implementations, the charge may be delivered at a faster or slower rate. As the graphs indicate, the mean total charge of the waveform in FIG. 3 is about 79 microCoulombs while the mean total charge of the waveform in FIG. 4 is about 60 microCoulombs. This means that CEW systems like those disclosed herein may use about 25% less total charge than conventional CEW systems like those with waveforms disclosed in FIG. 3.

Figure 5:
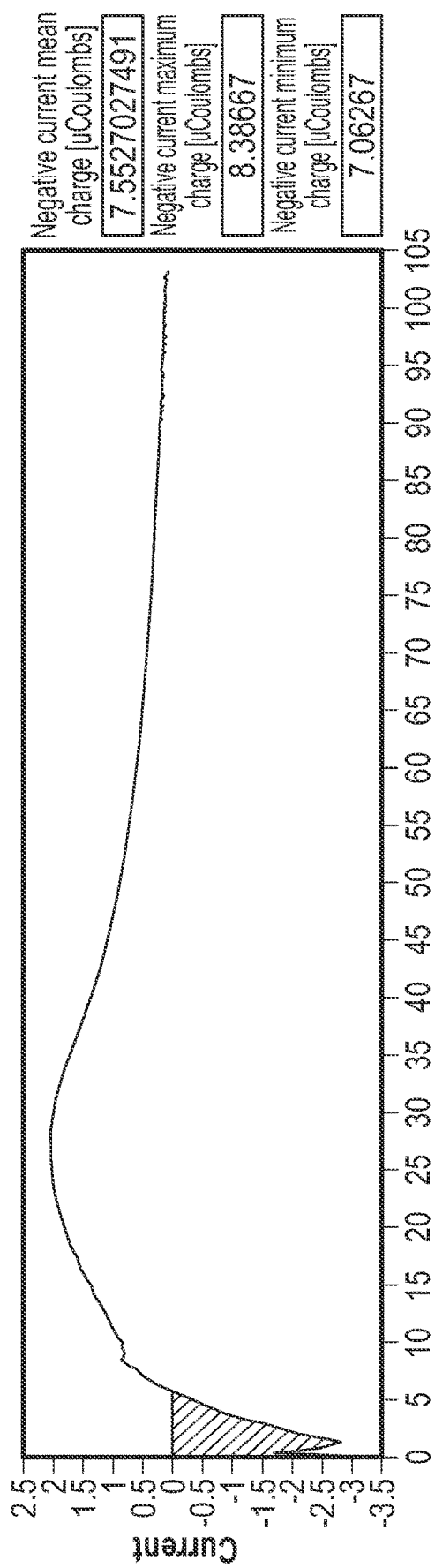
FIG. 5 is graph representing the negative current charge of a pulse of a conventional CEW.
Figure 6:
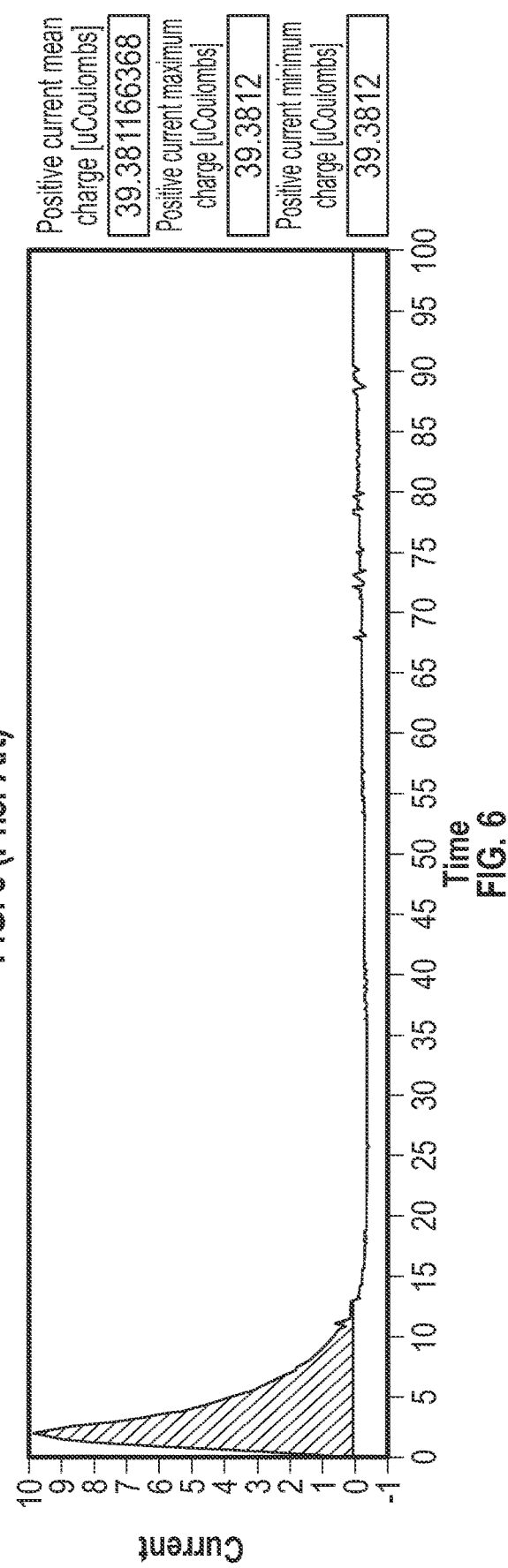
FIG. 6 is a graph representing the positive current charge of a pulse of a CEW.
Figure 7:
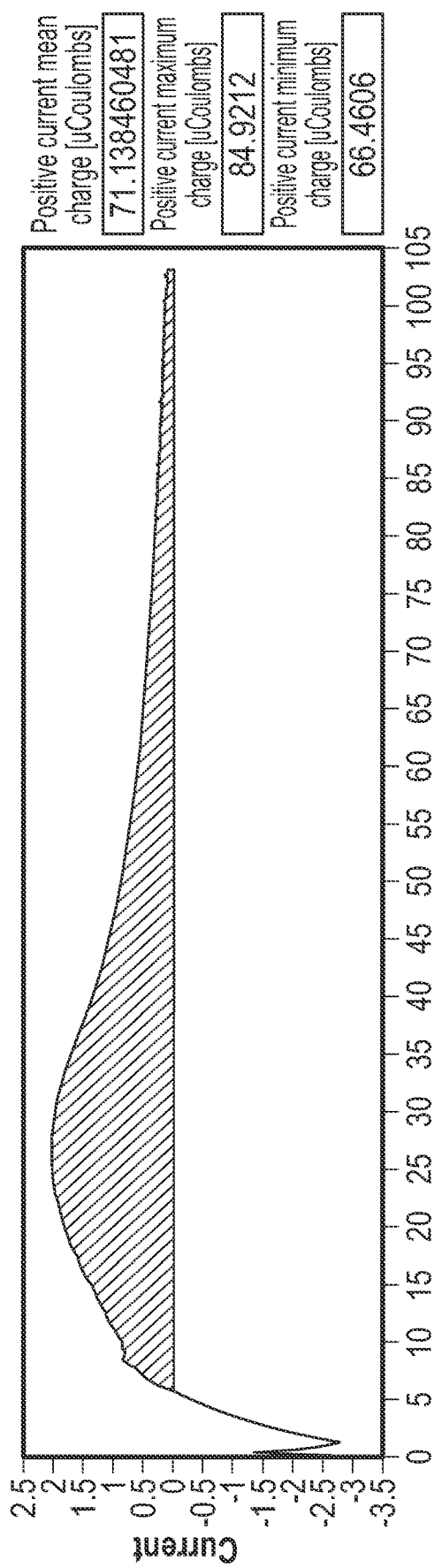
FIG. 7 is a graph representing the positive current charge of a pulse of a conventional CEW.
Figure 8:
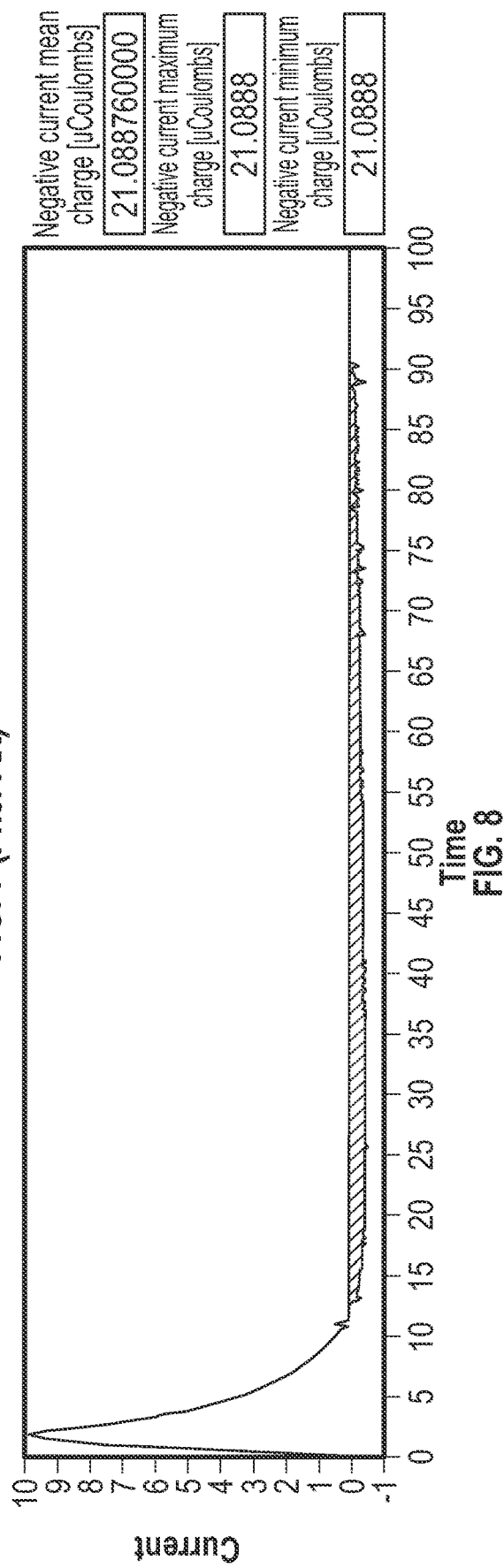
FIG. 8 is graph representing the negative current charge of a pulse of a CEW.

As can be observed, CEW weapon implementations like those disclosed herein may be regarded as combining the arc phase and stimulation phase into the single initial pulse while adding a long segment to the pulse with a smaller electrical charge which is referred to herein as a stimulation maintenance pulse/segment. Additional comparison data of the behavior of the pulses between the conventional CEW weapon and those disclosed herein may be found in FIGS. 5-8. In FIG. 5, a graph representing the negative current charge of a pulse of a conventional CEW weapon is illustrated. In FIG. 6, a graph representing the positive current charge of a pulse of a CEW weapon system like those disclosed here in is illustrated. In FIG. 7, a graph representing the positive current mean charge of a pulse of a conventional CEW weapon is illustrated. In FIG. 8, a graph of the negative mean charge of a pulse of a CEW weapon like those disclosed herein is illustrated, showing the low charge long duration negative voltage segment.

Because CEW weapon systems like those disclosed herein apply the majority of the charge in an initial short period of time, followed by a long, low current period of time (time duration), they may better mitigate the risk of causing harm to cardiac muscle tissue as compared to conventional CEW weapon systems. This is because the shorter duration of the application of the largest portion of the energy is less likely to come at a time where it may interfere with the operation of cardiac muscle. Further, by varying the magnitude of the current in the maintenance phase, or the long duration low current phase, the degree of effect on the target can be tuned, or the tuning can be performed to specific characteristics of the target (body weight, gender, desired cardiac safety factors, etc.).

The R-on-T phenomenon is an event that predisposes to dangerous arrhythmias. This phenomena is "a cardiac event in which a ventricular stimulus causes premature depolarization of cells that have not completely repolarized. It is noted on the electrocardiogram as a ventricular depolarization falling somewhere within a T wave." *Mosby's Medical Dictionary*, 9th Ed, Elsevier (2009). Although it is widely quoted in the literature relating to pacemakers, there appears to be a significant lack of scientific recognition that external electrical stimuli to the heart like those that occur during the discharge of a CEW may create similar predisposition to dangerous arrhythmias that are well understood/comparable to the situation where a pacemaker malfunctions.

This vulnerable period for the heart is in the middle of the T wave, when some of the myocardium is depolarized, some myocardium cells are repolarized, and some are in between. If an impulse occurs during this precise period, an erratic movement/re-entry circuit may theoretically be easily created.

An analogy where a stream of cars is serially being filled with gasoline by an attendant who regularly flicks his lighter indicates that the period of greatest danger is if the attendant flicks the lighter while a car is actually being fueled. While there is risk the entire time the attendant flicks the lighter around a gasoline pump, the point of greatest exposure is when the fuel tank of each car is open to atmosphere during fueling and vapor is entering the air.

This analogy indicates that with electroshock weapons, it is possible that a significant factor in the safety of the weapon is whether the delivered shock impulses were delivered to the target during the vulnerable period in the middle of a T wave, for example. Historically, when evaluating the safety of electroshock weapons the scientific research focuses on four main factors: 1). The magnitude of the electrical current delivered to the body, 2) The time duration of each electrical impulse delivered, 3) The time duration between each electrical impulse delivered, and 4) The number of impulses delivered in total during a single encounter. Control of these factors has a merit and contributes to the safety of the electroshock weapons.

However, the additional factor, the possibility of the weapon's discharging during the heart's vulnerable period is actually not under the weapon's control and with conventional systems may occur entirely as a matter of chance. If the application of the electroshock weapons discharge is not in any way synchronized to the subject's heart cycle, the probability for the R-on-T phenomenon to occur may increase significantly.

The problem may be represented schematically as follows: Consider two pulse waves of periods T1, T2, pulse widths t1, t2, and phases cp1, cp2, It is desired that these pulses overlap at least once within a given time interval; moreover, an overlap is not satisfactory unless its duration is at least as great as some assigned Tm. The starting phase's cp1 and cp2 are unknown for both waves. The mathematical problem, then, would be to calculate as a function of time the probability of at least one overlap of duration at least Tm.

It is possible to obtain mathematically exact values of the parameters of the problem, but obtaining practically exact values of the parameters is difficult. Although experimental error can sometimes be made amazingly small, it can never be eliminated. As might be expected from the possibility that the waves may "lock instep", the probability is extremely erratic with respect to very minute changes in the periods T1, T2. For example, let T1=T2=100t1=100t2 (Tm=0); a simple direct calculation then shows that, for all times greater than T1=T2, the desired probability is 0.03. Now if we let T1=T2+E, one wave-will "creep up" on the other, and eventually (for times greater than T1*T2/E) the probability is unity. Because of this, it may very well happen in a practical application that the parameters are known to an accuracy essentially sufficient only to give the obvious result; 0<P=<1.

Because of the difficulty of calculating and aligning the pulse waves, one of the target's heart and the other of the weapon, the way to reduce the likelihood of inducing cardiac arrhythmia would be to apply each maximum energy pulse for as short a duration as is effective. Because of this, it is possible that in conventional CEW weapon devices, increasing the duration of the high energy pulses may increase the cardiac risk to the target. Since the high net charge pulses disclosed herein are shorter in time than the high net charge pulses of conventional CEW weapons, they may, as a practical matter, act to reduce the cardiac risk to the target, particularly where the rate of application of the pulses between the conventional CEW system and the CEW systems disclosed herein are the same.

In various implementations, referring to FIG. 9, the CEW system may include a safety circuit 16 operatively coupled to the shock generating circuit 2. The safety circuit 16 may be configured to prevent the CEW from applying pulse trains to the target 14 after delivering a predetermined number of pulses or pulse trains. In particular implementations, the safety circuit 16 may be configured to prevent the CEW from applying any more than three pulse trains in response to pull(s) of the trigger of the weapon within a given period of time after the initial activation of the weapon. In more particular implementations, the system may limit maximum charge delivered to three consecutive 5 second trains of approximately 100 pulses for safety reasons. In other implementations, the trains may be longer or shorter than 5 seconds each and may contain more or less than 100 pulses each. This may be done via logic circuit(s) in the CEW weapon that counts the number of pulse trains and deactivates the weapon after the third train (or any other predetermined number of trains), requiring the user to manually rearm the weapon (or wait a period of time, 2-5 or more minutes before the weapon can be used to apply pulse trains to the target. Such logic circuits may be timing circuits. They may be the same as or similar to the timing circuit disclosed by U.S. Pat. No. 5,193,048 to Kaufman et. al., entitled "Stun Gun With Low Battery Indicator and Shutoff Timer," issued Mar. 9, 1993, the disclosure of which is hereby incorporated entirely herein by reference. This may also be done through use of a circuit that monitors the number of trains and then automatically enforces a fixed-time pause between the time of the last train and the time of the next train that the user can apply through pulling the trigger of the weapon.

Other options, including component temperature monitoring circuits, could be used in various implementations to track/monitor the number of pulse trains delivered to ensure that the target does not receive more than a specified amount of current in a given period of time. In implementations including component temperature monitoring circuits, the circuit may include a thermistor and a silicon controlled rectifier (SCR). As the thermistor receives heat energy from use of the CEW, the resistance of the thermistor decreases and a biasing voltage applied to the thermistor passes through the thermistor and begins to appear on the gate of the SCR. Once the biasing voltage rises to a predetermined level, the silicon controlled rectifier fires and pulls down or "grounds" the generator's power source, thereby preventing any further application of power to the shock generator circuit components until the biasing voltage on the gate of the silicon controlled rectifier reduces sufficiently for it to reset.

In various system implementations, referring to FIG. 9, the CEW may include a target heart rate detection circuit 18 coupled with the shock generating circuit 2. The target heart rate detection circuit 18 is configured to detect a target's heart rate. In various implementations the target heart rate detection circuit 18 detects the heart rate by detecting the heart muscle's electrophysiologic activity. The target heart rate detection circuit 18 may be similar to or the same as heart rate detection circuits used in electrocardiograms (ECGs) or in automated external defibrillators (AEDs). To further illustrate this, the target heart rate detection circuit and components thereof may be the same as or similar to the heart rate detection circuit and components disclosed in U.S. Pat. No. 4,619,265 to Morgan et. al. entitled "Interactive Portable Defibrillator Including ECG Detection Circuit," issued Oct. 28, 1986, the disclosure of which is hereby incorporated entirely herein by reference. Other heart rate detection circuits may be used in various implementations.

In various implementations, the target heart rate detection circuit 18 may be able to detect the target's heart rate when the first electrode 6 and the second electrode 8 are coupled to the target's clothing and are not in direct physical contact with the target's skin. In other implementations, the first electrode 6 and the second electrode 8 need to be physically/electrically coupled to the target's skin before the ECG will work. The circuit 18 may detect the heart rate of the target 18 either before the shock generating circuit 2 delivers an initial pulse or while the shock generating circuit is applying any pulses (i.e. during a pulse train). In various implementations, the system may initially detect one or more heart pulses and then using an algorithm, electrically synchronize the timing of application of the pulses by the shock generating circuit 2 with the target's heart rate to minimize the risk of applying a pulse during the heart's vulnerable period. This algorithm could be, by non-limiting example, a statistical regression based on collected heart rate data, a mathematically derived pulse wave matching calculation using the known and/or currently observed characteristics of the weapon, and any other method of calculating a time spacing between the observed heart pulse and a desired time to apply the electrical pulse to the target 14 to minimize the cardiac risk. The statistical calculations for the collected heart rate data may include, by non-limiting example, an average heart rate, a median heart rate, a moving average heart rate, control charted heart rate data, and any combination thereof.

In various implementations, an implementation of a method of shocking a target may include generating a plurality of pulses using a shock generating circuit 2 and applying the plurality of pulses to the target 14 using a first electrode 6 and a second electrode 8. The method may include deactivating the CEW after a predetermined number of pulses/pulse trains. The method may include detecting the target's heart rate, through a heart rate detection circuit, either before the plurality of pulses are applied to the target 14 or during the plurality of pulses being applied to the target 14. The method may include electrically synchronizing, through the target heart rate detection circuit 18 and the shock generating circuit 2, an application rate of the plurality of pulses with the target's heart rate.

In places where the description above refers to particular implementations of CEW systems and implementing components, sub-components, methods and sub-methods, it should be readily apparent that a number of modifications may be made without departing from the spirit thereof and that these implementations, implementing components, sub-components, methods and sub-methods may be applied to other CEW systems.

What is claimed is:

1. A conductive energy weapon (CEW) comprising:
   a shock generating circuit configured to couple to a power source; and a first electrode and a second electrode operatively coupled to the shock generating circuit;

wherein the shock generating circuit is configured to generate a first pulse train and deliver the first pulse train to a target using the first electrode and the second electrode;

wherein the shock generating circuit is configured to generate at least a second pulse train and deliver the at least second pulse train to the target using the first electrode and the second electrode;

wherein the first pulse train comprises two or more pulses having waveforms substantially identical with each other, each of the waveforms of the two or more pulses having both a positive voltage segment and a negative voltage segment wherein each pulse delivers substantially 60 microCoulombs of charge; and wherein each pulse of the first pulse train delivers a majority of its charge within the first 20% of an entire duration of each pulse.

2. The CEW of claim 1, wherein each of the waveforms reaches a peak amplitude in less than 10 microseconds from the beginning of each of the waveforms.

3. The CEW of claim 1, wherein each of the waveforms reaches a peak amplitude in less than 5 microseconds from the beginning of each of the waveforms.

4. The CEW of claim 1, wherein a duration of the positive voltage segment of each of the waveforms is substantially less than a duration of the negative voltage segment of each of the waveforms.

5. A conductive energy weapon (CEW) comprising:

a shock generating circuit configured to couple to a power source; and a first electrode and a second electrode operatively coupled to the shock generating circuit;

wherein the shock generating circuit is configured to generate a waveform of a first pulse applied to a target using the first electrode and the second electrode, the waveform comprising a positive voltage segment followed by a negative voltage segment;

wherein the shock generating circuit is configured to generate a waveform of a second pulse applied to the target using the first electrode and the second electrode, the waveform of the second pulse substantially the same as the waveform of the first pulse;

wherein each pulse delivers between 55 and 74 microCoulombs of charge; and wherein each pulse delivers a majority of its charge within the first 20% of an entire duration of each pulse.

6. The CEW of claim 5, wherein the CEW is a non-sinusoidal waveform weapon.

7. The CEW of claim 5, wherein each of the waveforms reaches a peak amplitude in less than 10 microseconds from the beginning of each of the waveforms.

8. The CEW of claim 5, wherein each of the waveforms reaches a peak amplitude in less than 5 microseconds from the beginning of each of the waveforms.

9. The CEW of claim 5, wherein a duration of the positive voltage segment of each of the waveforms is substantially less than a duration of the negative voltage segment of each of the waveforms.

10. A conductive energy weapon (CEW) comprising:

a shock generating circuit configured to couple to a power source; and a first electrode and a second electrode operatively coupled to the shock generating circuit;

wherein the shock generating circuit is configured to generate a waveform of a first pulse applied to a target using the first electrode and the second electrode, the waveform comprising a positive voltage segment followed by a negative voltage segment;

wherein the shock generating circuit is configured to generate a waveform of a second pulse applied to the target using the first electrode and the second electrode, the waveform of the second pulse substantially the same as the waveform of the first pulse;

wherein each pulse delivers between 55 and 74 microCoulombs of charge; and wherein a duration of the positive voltage segment of each of the waveforms is substantially less than a duration of the negative voltage segment of each of the waveforms.

* * * * *